United States Patent
Shin et al.

(10) Patent No.: US 12,364,120 B2
(45) Date of Patent: Jul. 15, 2025

(54) ORGANIC ELECTROLUMINESCENT DISPLAY DEVICE AND MANUFACTURING METHOD THEREOF

(71) Applicant: LG DISPLAY CO., LTD., Seoul (KR)

(72) Inventors: Sang Il Shin, Seoul (KR); Yong Rak Lee, Seoul (KR)

(73) Assignee: LG Display Co., Ltd. (KR)

( * ) Notice: Subject to any disclaimer, the term of this patent is extended or adjusted under 35 U.S.C. 154(b) by 518 days.

(21) Appl. No.: 17/837,208

(22) Filed: Jun. 10, 2022

(65) Prior Publication Data

US 2022/0416000 A1     Dec. 29, 2022

(30) Foreign Application Priority Data

Jun. 24, 2021 (KR) ........................ 10-2021-0082256

(51) Int. Cl.
*H10K 59/131* (2023.01)
*H10K 50/824* (2023.01)
*H10K 59/80* (2023.01)
*H10K 71/00* (2023.01)
*H10K 59/12* (2023.01)
*H10K 59/122* (2023.01)

(52) U.S. Cl.
CPC ......... *H10K 59/131* (2023.02); *H10K 50/824* (2023.02); *H10K 59/80522* (2023.02); *H10K 71/00* (2023.02); *H10K 59/1201* (2023.02); *H10K 59/122* (2023.02)

(58) Field of Classification Search
CPC ............. H10K 59/131; H10K 59/1201; H10K 59/122; H10K 59/80522; H10K 59/123; H10K 50/824; H10K 50/841; H10K 71/00

See application file for complete search history.

(56) References Cited

U.S. PATENT DOCUMENTS

| | | | | |
|---|---|---|---|---|
| 7,839,083 | B2 * | 11/2010 | Kubota | H10K 50/8426 313/506 |
| 2015/0270327 | A1 * | 9/2015 | Oh | H10K 59/1315 257/40 |
| 2021/0376037 | A1 * | 12/2021 | You | H10K 50/814 |

* cited by examiner

*Primary Examiner* — Sitaramarao S Yechuri
(74) *Attorney, Agent, or Firm* — Fish & Richardson P.C.

(57) ABSTRACT

An organic electroluminescent display device includes an auxiliary common voltage supply line disposed in a display area, and an auxiliary connection line interconnecting the auxiliary common voltage supply line and a cathode, in order to uniformly supply a common voltage to the display area, and the auxiliary connection line having a structure connectable to the cathode at an upper end of a spacer.

18 Claims, 7 Drawing Sheets

ORGANIC ELECTROLUMINESCENT DISPLAY DEVICE AND MANUFACTURING METHOD THEREOF

CROSS-REFERENCE TO RELATED APPLICATION

This application claims the priority of Korean Patent Application No. 10-2021-0082256 filed on Jun. 24, 2021, which is hereby incorporated by reference in its entirety.

BACKGROUND

Field of the Disclosure

The present disclosure relates to an organic electroluminescent display device, and more particularly to an organic electroluminescent display device and a manufacturing method thereof, in which a common voltage supply line (VSS) supplying a common voltage to a cathode is formed not only in a non-display area, but also in a display area and, such that a uniform common voltage is supplied throughout the entirety of the display area.

Description of the Background

Among display devices, an electroluminescent display device is a self-luminous display device and, as such, is excellent in terms of viewing angle, contrast ratio or the like. The electroluminescent display device does not require a separate backlight and, as such, has advantages in that lightness and slimness may be achieved, and driving with low power is possible. In particular, among electroluminescent display devices, an organic electroluminescent display device has advantages in that DC low-voltage driving is possible, response time is fast, and manufacturing costs are low.

An electroluminescent display device includes a plurality of electroluminescent devices. Each electroluminescent device constitutes a diode type light emitting device. The light emitting device includes an anode, a cathode, and an emission layer formed between the anode and the cathode. When a high-level voltage is applied to the anode, and a low-level voltage is applied to the cathode, a hole from the anode and an electron from the cathode migrate to the emission layer. The migrated electron and hole are combined with each other in the emission layer, thereby forming an exciton. Light energy is generated from the exciton.

The electroluminescent display device includes a display area on which an image is displayed, and a non-display area surrounding the display area. In particular, signal lines for applying a signal to a plurality of light emitting devices arranged in the display area are disposed in the non-display area and, as such, occupy a certain space.

Generally, the electroluminescent display device is classified into a bottom emission type in which the display device emits light at a back side and a top emission type in which the display device emits light at a front side.

The top emission type electroluminescent display device generally uses a transparent conductive material such as indium tin oxide (ITO) for the cathode. However, the transparent conductive material exhibits high resistivity.

Meanwhile, at present, demand for a large-area full-screen display device is increasing. However, when a large-area full-screen display device is realized, there may be a problem in that a great voltage drop may occur at a central portion of a display area far from a common voltage supply line and, as such, it may be impossible to apply a uniform common voltage to the entirety of the display area.

SUMMARY

Accordingly, the present disclosure is directed to an organic electroluminescent display device and a manufacturing method thereof that substantially obviate one or more problems due to limitations and disadvantages described above.

More specifically, the present disclosure is to provide an organic electroluminescent display device in which an auxiliary common voltage supply line is provided in a display area, for application of a uniform common voltage to the entirety of the display area, and a manufacturing method thereof.

The present disclosure is also to provide an organic electroluminescent display device including an auxiliary connection line interconnecting a cathode formed to have an integrated structure in the entirety of a display area and an auxiliary common voltage supply line formed in the display area.

Additional advantages and features of the present disclosure will be set forth in part in the description which follows and in part will become apparent to those having ordinary skill in the art upon examination of the following or may be learned from practice of the present disclosure. Other advantages of the present disclosure may be realized and attained by the structure particularly pointed out in the written description and claims hereof as well as the appended drawings.

To achieve these and other advantages and in accordance with the purpose of the present disclosure, as embodied and broadly described herein, an organic electroluminescent display device includes a substrate comprising a display area with unit pixels disposed therein, and a non-display area disposed around the display area, a plurality of gate lines and data lines disposed on the substrate, a thin film transistor disposed in the display area, a planarization layer formed on the thin film transistor, for surface planarization, a first electrode formed on the planarization layer on a unit pixel basis, a bank layer disposed on the first electrode, to define a light emission region of the unit pixel, a spacer disposed on the bank layer, a second electrode corresponding to the first electrode, an emission layer disposed between the first electrode and the second electrode, a common voltage supply line disposed in the non-display area and connected to the second electrode, an auxiliary common voltage supply line disposed in the display area and connected to the common voltage supply line, and a first auxiliary connection line interconnecting the auxiliary common voltage supply line and the second electrode in the display area.

The first auxiliary connection line may be connected to the second electrode at an upper end of the spacer.

The auxiliary common voltage supply line may be disposed between the emission layer and the thin film transistor.

The auxiliary common voltage supply line may be formed on a same layer as the first electrode by a same material as the first electrode, and may be arranged in a form of a lattice or a stripe while being insulated from the first electrode.

A power supply line configured to supply power to the thin film transistor may be further disposed in the display area, and the auxiliary common voltage supply line may be formed by a same material as the power supply line while being disposed on a same layer as the power supply line in parallel to the power supply line.

The auxiliary common voltage supply line may be formed by a same material as the data lines, and may be disposed on a same layer as the data lines in parallel to the data lines.

The first auxiliary connection line may be formed on upper surfaces of the bank layer and the spacer, and may be connected to the auxiliary common voltage supply line via a first contact hole formed at the bank layer.

The second electrode may be connected to the common voltage supply line by a second auxiliary connection line formed in the non-display area by a same material as the first electrode.

The common voltage supply line and the second auxiliary connection line may surround the display area.

The auxiliary common voltage supply line may have a greater arrangement density per unit area at a central portion of the display area than at an edge portion of the display area.

In another aspect of the present disclosure, a method for manufacturing an organic electroluminescent display device includes preparing a substrate including a display area and a non-display area formed around the display area, forming, on the substrate, a driving device layer, forming a planarization layer on the driving device layer, and forming, on the planarization layer, a light emitting device layer including a first electrode, an emission layer and a second electrode, wherein a common voltage supply line is further formed in the non-display area, an auxiliary common voltage supply line connected to the common voltage supply line is further formed in the display area, and a first auxiliary connection line interconnecting the second electrode and the auxiliary common voltage supply line is further formed in the display area.

The forming a light emitting device layer may include simultaneously forming an auxiliary common voltage supply line and the first electrode insulated from the auxiliary common voltage supply line on the planarization layer, forming, on the first electrode, a bank layer defining a light emission region and a spacer protruding upwards from the bank layer, forming the first auxiliary connection line disposed over an upper end of the spacer and the bank layer and connected to the auxiliary common voltage supply line, depositing the emission layer in the light emission region, and forming the second electrode disposed on the emission layer and connected to the first auxiliary connection line at the upper end of the spacer.

The auxiliary common voltage supply line is parallel to a data line.

A second auxiliary connection line interconnecting the common voltage supply line and the second electrode may be further formed in the non-display area, simultaneously with the first electrode, in the forming a light emitting device layer.

The forming a light emitting device layer may include forming, on the planarization layer, a bank layer including a contact hole exposing the auxiliary common voltage supply line while defining the light emission region, through a photolithography process, and forming a first auxiliary connection line connected to the auxiliary common voltage supply line via the contact hole.

The forming a light emitting device layer may include forming the emission layer on the bank layer formed with the auxiliary common voltage supply line, removing the emission layer remaining at the upper end of the spacer, thereby exposing the auxiliary common voltage supply line, and forming the second electrode connected to the auxiliary common voltage supply line at the upper end of the spacer.

The removing the emission layer remaining at the upper end of the spacer, thereby exposing the auxiliary common voltage supply line may include aligning an organic material adsorption substrate on the bank layer and the spacer with the emission layer deposited thereon, and bringing the organic material adsorption substrate and the upper end of the spacer into contact with each other, thereby adsorbing the emission layer at the upper end of the spacer.

The organic material adsorption substrate may further include an embossing adsorption pattern aligned with the upper end of the spacer.

The data line, the common voltage supply line, and the auxiliary common voltage supply line may be simultaneously formed.

The method may further include forming a power supply line, and the power supply line and the auxiliary common voltage supply line are formed on a same layer.

It is to be understood that both the foregoing general description and the following detailed description of the present disclosure are exemplary and explanatory and are intended to provide further explanation of the present disclosure as claimed.

BRIEF DESCRIPTION OF THE DRAWINGS

The accompanying drawings, which are included to provide a further understanding of the present disclosure and are incorporated in and constitute a part of the present disclosure, illustrate aspect(s) of the present disclosure and along with the description serve to explain the principle of the present disclosure.

In the drawings.

DETAILED DESCRIPTION

Figure 1:
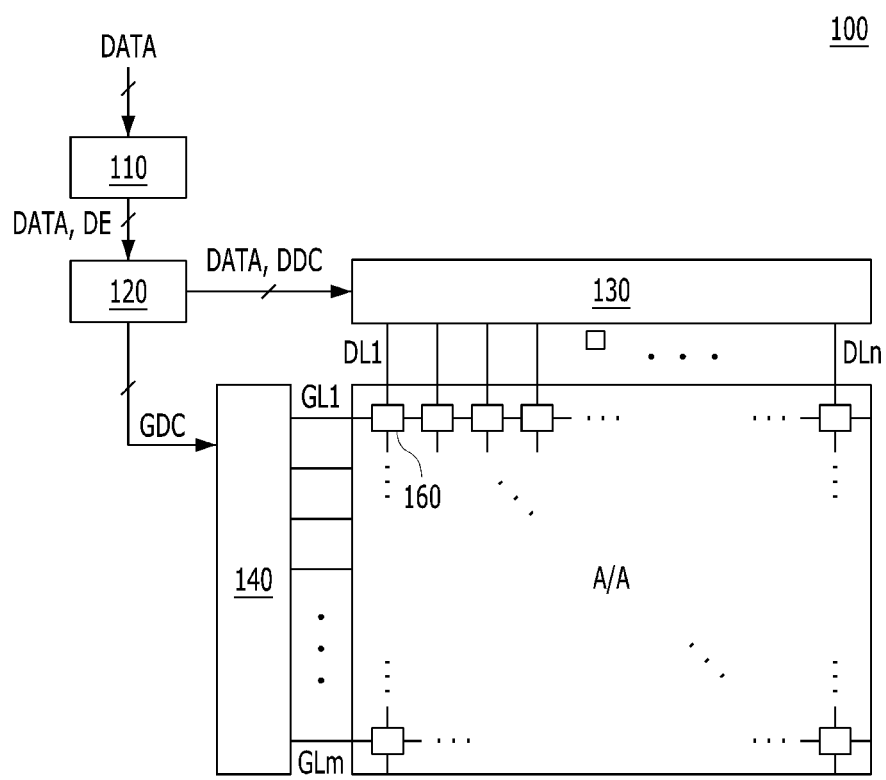
FIG. 1 is a block diagram of an organic electroluminescent display device according to an aspect of the present disclosure.

Advantages and features of the present disclosure, and implementation methods thereof, will be clarified through following aspects described with reference to the accompanying drawings. However, the present disclosure may be embodied in different forms and should not be construed as limited to the aspects set forth herein. Rather, these aspects are provided so that the present disclosure will be thorough and complete, and will fully convey the scope of the present disclosure to those skilled in the art. Further, the present disclosure is defined only by the categories of the claims.

A shape, a size, a ratio, an angle, and a number disclosed in the drawings for describing aspects of the present disclosure are merely an example, and thus, the present disclosure is not limited to the illustrated details. The same reference numerals designate substantially the same elements throughout the specification. In the following description, when the detailed description of the relevant known function or configuration is determined to unnecessarily obscure the gist of the present disclosure, the detailed description will be omitted.

When "comprise", "have", and "include" described in the specification are used, another part may be added unless "only~" is used. Terms in a singular form may include plural forms unless stated otherwise.

In construing an element, the element is construed as including a tolerance range, even if there is no explicit description.

In describing a position relationship between two elements, for example, when the position relationship is described using "upon~", "above~", "below~", and "next to~", one or more other elements may be interposed between the two elements unless "just" or "directly" is used. The case in which an element or a layer is referred to as being "on" another element or layer includes both the case in which the element is disposed directly on the other element and the case in which an intervening element is present.

In describing a temporal relationship, for example, when the temporal order is described as "after~", "subsequent~", "next~", and "before~", the case which is not continuous may also be included unless "just" or "directly" is used.

It will be understood that, although the terms "first", "second", etc. may be used herein to describe various elements, these elements should not be limited by these terms. These terms are only used to distinguish one element from another. For example, a first element referred to in the following description may represent a second element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

The following aspects may be partially or overall coupled or combined, and may be technically linked and implemented in various manners. The aspects may be independently implemented, or may be implemented in a co-dependent relationship.

An example of an organic electroluminescent display device according to an exemplary aspect of the present disclosure will now be described in detail in conjunction with the accompanying drawings. Wherever possible, the same reference numbers will be used throughout the drawings to refer to the same or like parts.

FIG. 1 is a block diagram of an organic electroluminescent display device 100 according to an aspect of the present disclosure.

Referring to FIG. 1, the organic electroluminescent display device 100 includes an image processing unit 110, a timing controller 120, a data driver 130, a gate driver 140, and a display area A/A.

The image processing unit 110 outputs a data enable signal DE as well as a data signal DATA supplied from an exterior thereof. The image processing unit 110 may output one or more of a vertical synchronization signal, a horizontal synchronization signal and a clock signal, in addition to the data enable signal DE.

The timing controller 120 receives, from the image processing unit 110, the data signal DATA as well as the data enable signal DE, a drive signal including the vertical synchronization signal, the horizontal synchronization signal and the clock signal, or the like. Based on the drive signal, the timing controller 120 outputs a gate timing control signal GDC for control of operation timing of the gate driver 140 and a data timing control signal DDC for control of operation timing of the data driver 130.

In response to the data timing control signal DDC supplied from the timing controller 120, the data driver 130 samples and latches the data signal DATA supplied from the timing controller 120, converts the resultant data signal into a gamma reference voltage, and outputs the gamma reference voltage. The data driver 130 outputs the data signal DATA through data lines DL1 to DLn.

The gate driver 140 outputs a gate signal while shifting a gate voltage level in response to the gate timing control signal GDC supplied from the timing controller 120. The gate driver 140 outputs the gate signal through gate lines GL1 to GLm.

The display area A/A displays an image as a pixel 160 emits light in accordance with the data signal DATA and the gate signal respectively supplied from the data driver 130 and the gate driver 140.

The pixel 160 is defined by one group of sub-pixel regions defined through intersection between a plurality of gate lines GL1 to GLm arranged in parallel in a row direction on the display area A/A and a plurality of data lines DL1 to DLn arranged in a column direction on the display area A/A while perpendicularly intersecting the plurality of gate lines GL1 to GLm.

Here, "one group" means that at least three sub-pixels, that is, red, green and blue sub-pixels, constitute one group in order to configure one pixel.

In the specification, for convenience of description, each sub-pixel region is divided into a driving device part, in which a plurality of transistors and a capacitor are arranged in order to drive a pixel, and a light emitting device part constituted by two electrodes and an emission layer interposed therebetween, for light emission. In addition, a plurality of layers constituting the driving device part will be referred to as a "driving device layer", and a plurality of layers constituting the light emitting device part will be referred to as a "light emitting device layer".

The driving device layer and the light emitting device layer are separated from each other by a protective layer referred to as a "planarization layer", and the driving device part and the light emitting device part are electrically interconnected via a contact hole formed at the planarization layer.

Each of the plurality of gate lines GL1 to GLm is connected to the gate driver 140 and, as such, receives a gate signal from the gate driver 140. Each of the plurality of data lines DL1 to DLn is connected to the data driver 130 and, as such, receives a data signal from the data driver 130.

Figure 2:
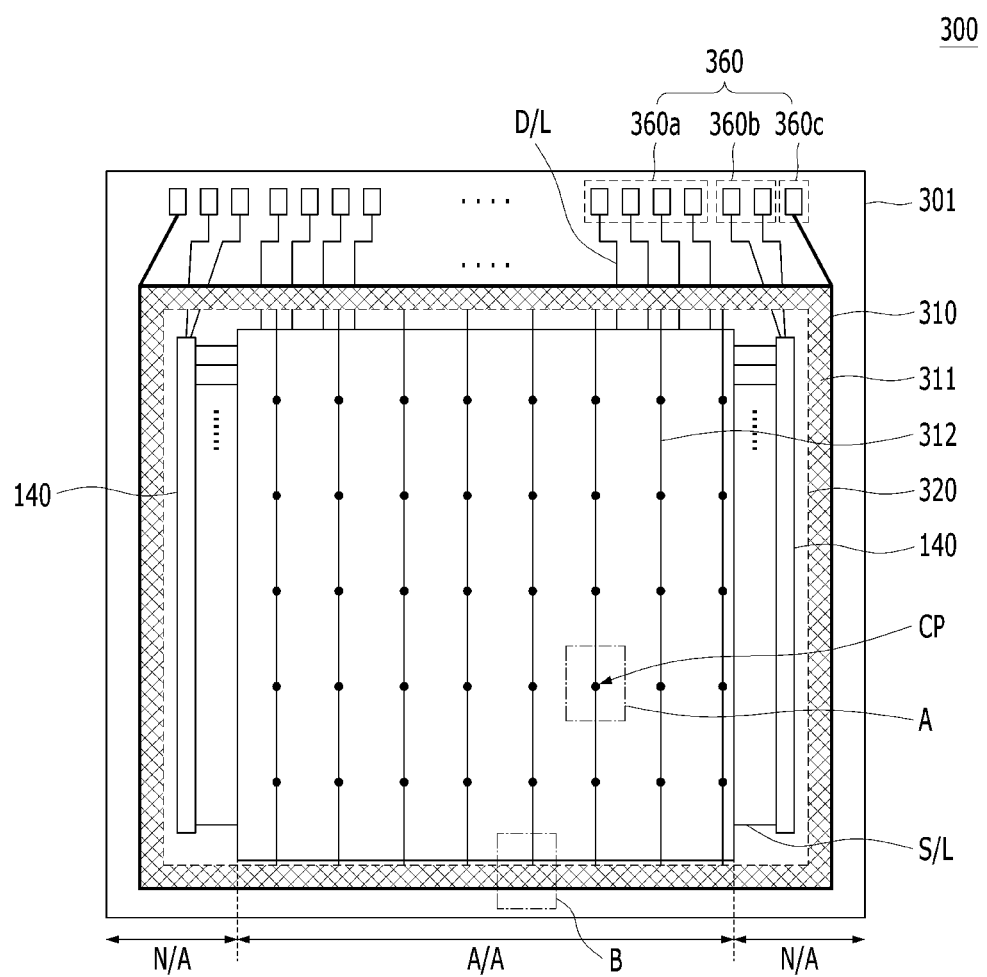
FIG. 2 is a plan view of an array substrate of an organic electroluminescent display device according to an aspect of the present disclosure.

FIG. 2 is a plan view of a display panel 300 explaining the subject matter of the present disclosure. The display panel 300 includes a display area A/A disposed on a substrate 301, and the non-display area N/A surrounds the display area A/A at an outside of the display area A/A. The substrate 301 is a base on which various devices are installed, and may be a glass substrate, a plastic substrate, a flexible substrate, or the like. For example, the substrate 301 may be made of a material such as polyimide (PI), polyethylene terephthalate (PET), polyethylene naphthalate (PEN), polycarbonate (PC), polyethersulfone (PES), polyarylate (PAR), polysulfone (PSF), cyclic-olefin copolymer (COC), or the like. In particular, when the substrate 301 is made of an organic layer material such as polyimide (PI), polyethylene terephthalate (PET), polyethylene naphthalate (PEN), polycarbonate (PC), polyethersulfone (PES), polyarylate (PAR), polysulfone (PSF), cyclic-olefin copolymer (COC), or the like, the substrate 301 may be configured by including a plurality of organic layers, and an insulating layer of an inorganic material interposed among the plurality of organic layers in order to prevent penetration of moisture or foreign matter.

Figure 7:
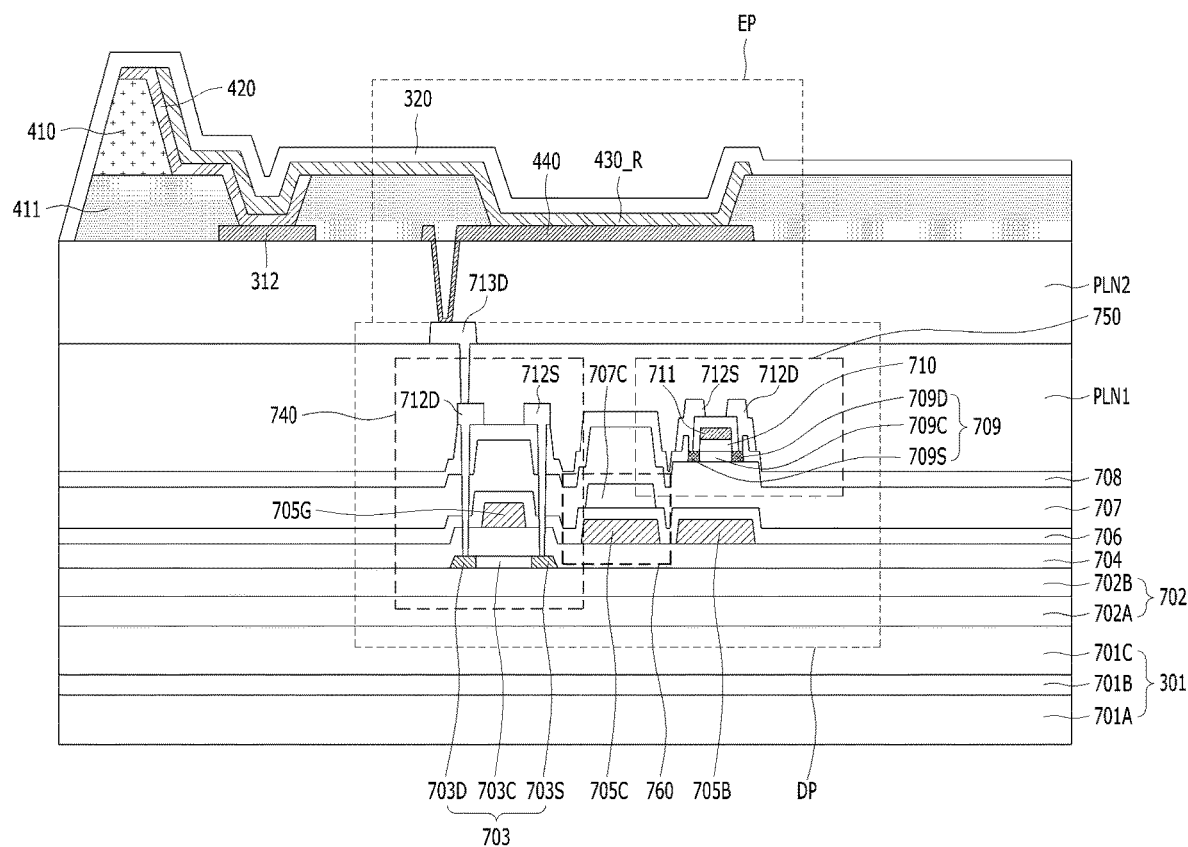
FIG. 7 is a cross-sectional view corresponding to a region A of FIG. 2, showing a stack structure according to an aspect of the present disclosure.

Referring to FIG. 7, the substrate 301 may be constituted by a stack structure in which an inorganic insulating layer 701B such as a silicon oxide ($SiO_2$) layer is interposed among a plurality of organic layers 701A and 701C.

In the display area A/A, a plurality of gate lines S/L is arranged in parallel, and a plurality of data lines D/L perpendicularly intersecting the gate lines S/L is arranged in parallel. A sub-pixel is formed in one of regions defined through intersection between the gate lines S/L and the data lines D/L.

Referring to FIG. 7, the sub-pixel includes a driving device part DP for driving a pixel, and a light emitting device part EP connected to the driving device part DP. The driving device part DP may be configured by including a plurality of thin film transistors. The driving device part DP includes a plurality of thin film transistors and a storage capacitor 760.

The configuration of the driving device part DP will be described in more detail with reference to FIG. 7.

The driving device part DP includes a first thin film transistor 740, which may be a driving thin film transistor, a second thin film transistor 750, which may be a switching thin film transistor, and the storage capacitor 760. For convenience of description, FIG. 7 shows one driving thin film transistor 740, one switching thin film transistor 750, and one storage capacitor 760.

A polycrystalline semiconductor layer 703 included in the driving thin film transistor 740 is formed on a lower buffer layer 702B. The polycrystalline semiconductor layer 703 includes a channel region 703C, a source region 703S, and a drain region 703D.

The channel region 703C overlaps with a first gate electrode 705G under the condition that a first gate insulating layer 704 is interposed therebetween. The channel region 703C is disposed between a first source electrode 712S and a first drain electrode 712D. The source region 703S is electrically connected to the first source electrode 712S, and the drain region 703D is electrically connected to the first drain electrode 712D.

The polycrystalline semiconductor layer 703 exhibits higher mobility than an amorphous semiconductor layer or an oxide semiconductor layer. In addition, the polycrystalline semiconductor layer 703 exhibits low power consumption and excellent reliability during driving. Thus, the polycrystalline semiconductor layer 703 is suitable as a driving thin film transistor.

A multi-buffer layer 702A and the lower buffer layer 702B are disposed between the polycrystalline semiconductor layer 703 as described above and the substrate 301. The multi-buffer layer 702A delays diffusion of moisture or oxygen penetrating the substrate 301. The multi-buffer layer 702A is configured as a silicon nitride layer ($SiN_x$) and a silicon oxide layer ($SiO_x$) alternate at least one time.

The lower buffer layer 702B functions to protect the polycrystalline semiconductor layer 703 and to block various kinds of defects introduced from the substrate 301. The lower buffer layer 702B may be formed by an amorphous silicon (a-Si) layer, a silicon nitride layer ($SiN_x$), a silicon oxide layer ($SiO_x$) or the like.

The first gate electrode 705G is formed on the first gate insulating layer 704. The first gate electrode 705G overlaps with the channel region 703C of the polycrystalline semiconductor layer 703 under the condition that the first gate insulating layer 704 is interposed therebetween. The first gate electrode 705G may be constituted by the same material as a lower electrode 705C of the storage capacitor 760 and a light blocking layer 705B. For example, the first gate electrode 705G may be a single layer or multiple layers made of one or an alloy of molybdenum (Mo), aluminum (Al), chromium (Cr), gold (Au), titanium (Ti), nickel (Ni), neodymium (Nd), and copper (Cu). However, the present disclosure is not limited thereto.

A first interlayer insulating layer 706 disposed on the polycrystalline semiconductor layer 703 is formed by an inorganic layer having a greater hydrogen particle content than a second gate insulating layer 710 and an upper buffer layer 707. For example, the first interlayer insulating layer 706 is constituted by a silicon nitride layer ($SiN_x$) formed through a deposition process using ammonia gas ($NH_3$ gas), and the second gate insulating layer 710 and the upper buffer layer 707 are formed by a silicon oxide layer ($SiO_x$).

Hydrogen particles included in the first interlayer insulating layer 706 are diffused into the polycrystalline semiconductor layer 703 in a hydrogenation process and, as such, voids in the polycrystalline semiconductor layer 703 are filled with hydrogen. Accordingly, the polycrystalline semiconductor layer 703 is structurally stabilized, thereby preventing degradation of characteristics of the first thin film transistor 740.

An upper electrode 707C of the storage capacitor 760 overlapping with the lower electrode 705C of the storage capacitor 760 is formed on the first interlayer insulating layer 706. Although not shown, the upper electrode 707C of the storage capacitor 760 is electrically connected to the second thin film transistor 750.

The first source electrode 712S and the first drain electrode 712D are connected to the source region 703S and the drain region 703D of the polycrystalline semiconductor layer 703 by contact holes penetrating the first gate insulating layer 704, the first interlayer insulating layer 706, the upper buffer layer 707 and the second interlayer insulating layer 708, respectively.

An oxide semiconductor layer 709 of the second thin film transistor 750 is formed after an activation and hydrogenation process for the polycrystalline semiconductor layer 703 of the first thin film transistor 740. That is, the oxide semiconductor layer 709 is disposed over the polycrystalline semiconductor layer 703. Accordingly, the oxide semiconductor layer 709 is not exposed to a high-temperature atmosphere of the activation and hydrogenation process for the polycrystalline semiconductor layer 703 and, as such, damage of the oxide semiconductor layer 709 is prevented. Accordingly, an enhancement in reliability is achieved.

The second thin film transistor 750 is disposed on the substrate 301 such that the second thin film transistor 750 is spaced apart from the first thin film transistor 740. The second thin film transistor 750 includes a second gate electrode 711, the oxide semiconductor layer 709, a second source electrode 712S, and a second drain electrode 712D.

The second gate electrode 711 overlaps with the oxide semiconductor layer 709 under the condition that the second gate insulating layer 710 is interposed therebetween. The oxide semiconductor layer 709 forms a channel between the second source electrode 712S and the second drain electrode 712D. The oxide semiconductor layer 709 is formed by an oxide material including at least one metal selected from Zn, Cd, Ga, In, Sn, Hf, and Zr.

The second interlayer insulating layer 708, the second gate insulating layer 710, and the upper buffer layer 707 are formed by an inorganic layer having lower hydrogen particle content than the first interlayer insulating layer 706. For example, the second interlayer insulating layer 708, the second gate insulating layer 710 and the upper buffer layer 707 are formed by a silicon oxide layer ($SiO_x$), and the first interlayer insulating layer 706 is formed by a silicon nitride layer ($SiN_x$). Accordingly, it may be possible to prevent hydrogen particles of the first interlayer insulating layer 706 and the polycrystalline semiconductor layer 210 from being diffused into the oxide semiconductor layer 709 during a thermal treatment process for the oxide semiconductor layer 709.

The second source electrode 712S and the second drain electrode 712D are formed on the second interlayer insulating layer 708, and may be a single layer or multiple layers made of one or an alloy of molybdenum (Mo), aluminum (Al), chromium (Cr), gold (Au), titanium (Ti), nickel (Ni), neodymium (Nd), and copper (Cu). However, the present disclosure is not limited thereto.

The second source electrode 712S and the second drain electrode 712D are connected to the source region 709S and the drain region 709D of the oxide semiconductor layer 709 by contact holes formed at the second interlayer insulating layer 708, respectively.

The driving device part DP including the first thin film transistor 740 and the second thin film transistor 750 is insulated from the light emitting device part EP by a first planarization layer PLN1 and a second planarization layer PLN2.

Meanwhile, the light emitting device part EP includes a first electrode 440 as an anode, a second electrode 320 as a cathode facing the first electrode 440, and an emission layer 430_R interposed between the first electrode 440 and the second electrode 320. The first electrode 440 may be formed for each sub-pixel, and the second electrode 320 may be formed to have an integrated structure such that the second electrode 320 covers the entirety of the display area A/A.

In FIG. 2, the second electrode 320 is shown as covering, as the cathode, the entirety of the display area A/A. The configuration of the light emitting device part EP will be further described later with reference to FIGS. 5 to 7.

Referring to FIG. 2, driving circuits for driving pixels formed in the display area A/A are formed in the non-display area N/A. That is, in a gate-on panel (GIP) type display panel in which a gate driver 140 is formed on the substrate 301, the gate driver 140, which provides a gate signal to the driving device part DP, may be installed in the non-display area N/A. A data driver (not shown), which provides a data signal to the driving device part DP, may be formed at a flexible printed circuit board (FPCB) (not shown) configured separately from the substrate 301, to provide the data signal.

The FPCB (not shown) is connected to pads 360 formed in the non-display area N/A of the substrate 301. The pads 360 may be classified into a data pad 360a, to which a data signal is applied, a gate pad 360b, to which a gate signal is applied, and a common voltage pad 360c, to which a common voltage is applied.

Meanwhile, a common voltage supply line 310, which applies a common voltage to the display area A/A, is formed in the non-display area N/A. The common voltage supply line 310 may be formed to surround the display area A/A.

The common voltage supply line 310 is connected to a cathode 320 formed in the display area A/A and, as such, is required to apply a uniform common voltage to the entirety of the display area A/A having a wide area. To this end, in an aspect of the present disclosure, an auxiliary common voltage supply line 312 is installed in the display area A/A, in addition to the common voltage supply line 310.

The common voltage supply line 310 may be constituted by a metal having the same component as a data line formed in the display area A/A. Accordingly, a connection line interconnecting the common voltage supply line 310 and the cathode 320, which are formed on different layers, respectively, is further needed.

In this aspect, a second auxiliary connection line 311 is formed, as the connection line, between the cathode 320 and the common voltage supply line 310. The second auxiliary connection line 311 may be disposed in the non-display area N/A, to surround the display area A/A. The second auxiliary connection line 311 may be formed on the same layer as a first electrode 440, which is an anode, using the same material as the first electrode 440.

Figure 8:
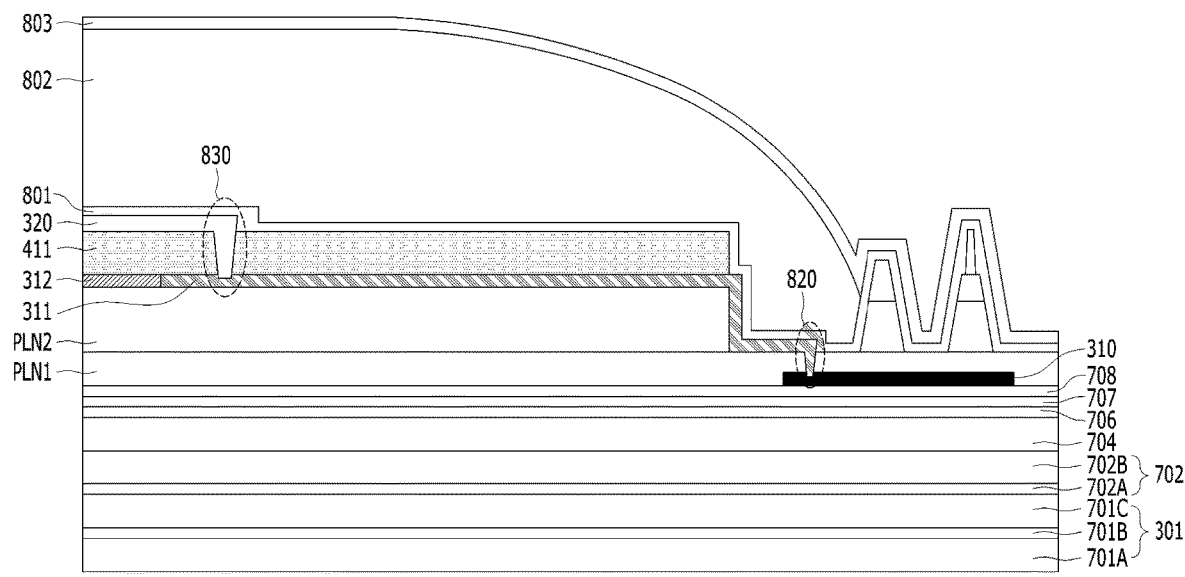
FIG. 8 is a cross-sectional view corresponding to a region B of FIG. 2, showing a stack structure in a non-display area according to an aspect of the present disclosure.

In addition, referring to FIG. 8 showing a cross-section of a region B in FIG. 2, the second auxiliary connection line 311 is connected to the common voltage supply line 310 via a first contact hole 820, and is connected to the cathode 320 via a second contact hole 830. Accordingly, the second auxiliary connection line 311 interconnects the common voltage supply line 310 formed in the non-display area N/A and the cathode 320 covering the display area A/A and, as such, a common voltage may be supplied to the cathode 320.

Referring to FIG. 2, the auxiliary common voltage supply line 312 is formed to extend across the display area A/A in the form of a plurality of parallel lines.

Referring to FIG. 2, in a first aspect of the present disclosure, the auxiliary common voltage supply line 312 is formed in the display area A/A in parallel to a data line D/L. In addition, the auxiliary common voltage supply line 312 may be formed on the same layer as the second auxiliary connection line 311, using the same material as the second auxiliary connection line 311. That is, the auxiliary common voltage supply line 312 may be formed by the same material as the first electrode 440, which is an anode, and may be formed on the same layer as the second auxiliary connection line 311 formed by the same material as the first electrode 440. Referring to FIG. 8, the auxiliary common voltage supply line 312 extends to the display area A/A while being connected to the second auxiliary connection line 311 on the second planarization layer PLN2.

Since the auxiliary common voltage supply line 312 and the second auxiliary connection line 311 may be formed on the same layer, using the same material, it may be possible to simultaneously form the auxiliary common voltage supply line 312 and the second auxiliary connection line 311 through one mask process. Accordingly, the auxiliary common voltage supply line 312 may be formed without addition of a separate mask process thereof.

Meanwhile, in conjunction with the first aspect of the present disclosure referring to FIG. 2, the auxiliary common voltage supply line 312 has been described as being formed in parallel to the data line D/L.

However, in the first aspect of the present disclosure, the auxiliary common voltage supply line 312 and the data line D/L are disposed on different layers, respectively, and, as such, it is unnecessary for the auxiliary common voltage supply line 312 and the data line D/L to be arranged in parallel. That is, referring to FIG. 7, the auxiliary common voltage supply line 312 is disposed on the second planarization layer PLN2, and the data line D/L is disposed on a second interlayer insulating layer 708 under the second planarization layer PLN2, and, as such, it may be possible to arrange the auxiliary common voltage supply line 312 in a direction intersecting the data line D/L, that is, a direction of the gate line S/L.

In addition, the auxiliary common voltage supply line 312 may be arranged in both the direction of the gate line S/L and the direction of the data line D/L and, as such, may be configured in the form of a lattice.

Referring to FIG. 2, the cathode 320 widely extends to cover the entirety of the display area A/A and, as such, the cathode 320, which is disposed at a central portion of the display area A/A, is relatively far from the common voltage supply line 310, thereby causing a great voltage drop to be generated. In particular, in a light emitting display device of a top emission type in which light generated from an emission layer proceeds in an upward direction of a substrate, a voltage drop generated at the central portion of the display area is further great because a transparent electrode having a great unit resistance is used as the cathode electrode 320. To this end, in an aspect of the present disclosure, the auxiliary common voltage supply line 312 is formed in the display area A/A, and is connected to the cathode 320 in the display area A/A, and, as such, may prevent a voltage drop.

Figure 5:
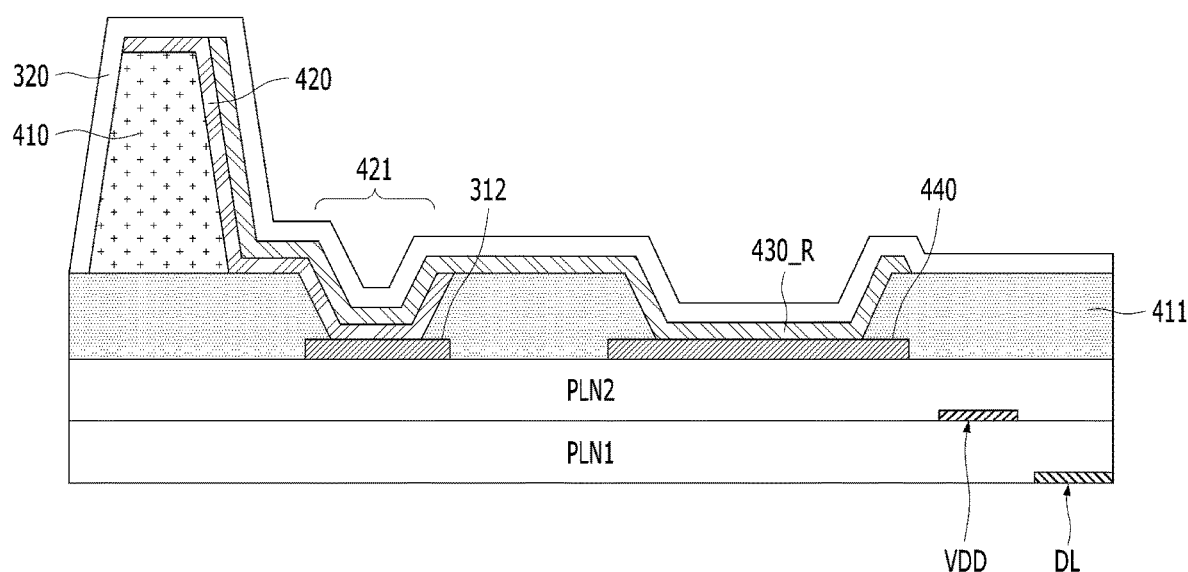
FIG. 5 is a cross-sectional view of a region of FIG. 4 taken along line I-I' in FIG. 4.

A region A in FIG. 2 shows that the auxiliary voltage supply line 312 and the cathode 320 are interconnected through a connection point CP in the display area A/A. In addition, the region B in FIG. 2 shows a portion of the non-display area N/A in which the auxiliary voltage supply line 312 and the common voltage supply line 310 are interconnected. FIG. 5 is a cross-sectional view of the region A in FIG. 2, and FIG. 8 is a cross-sectional view of the region B in FIG. 2. Configurations of the cross-sections will be described later in more detail with reference to FIGS. 5 to 8.

Referring to FIG. 2, the connection point CP may be formed in plural in the display area A/A. That is, connection points CP interconnecting the cathode 320 and the auxiliary common voltage supply line 312 are formed in a plurality of regions in the display area A/A, respectively.

Meanwhile, in the aspect of the present disclosure referring to FIG. 2, auxiliary common voltage supply lines 312 have been described as being arranged with uniform spacing in the display area A/A. In another aspect of the present disclosure, however, auxiliary common voltage supply lines 312 may be arranged such that the spacing among the auxiliary common voltage supply lines 312 disposed at the central portion of the display area A/A is narrow, and the spacing among the auxiliary common voltage supply lines 312 disposed at an edge portion of the display area A/A is wide and, as such, compensation for a voltage drop may be achieved. In addition, in a variant of the other aspect of the present disclosure, the auxiliary common voltage supply lines 312 disposed at the central portion of the display area A/A may have a greater line width than those of other regions in the display area A/A and, as such, a voltage drop may be reduced. As a result, it may be possible to obtain an effect in which a uniform common voltage is applicable to the entirety of the display area A/A.

Figure 3:
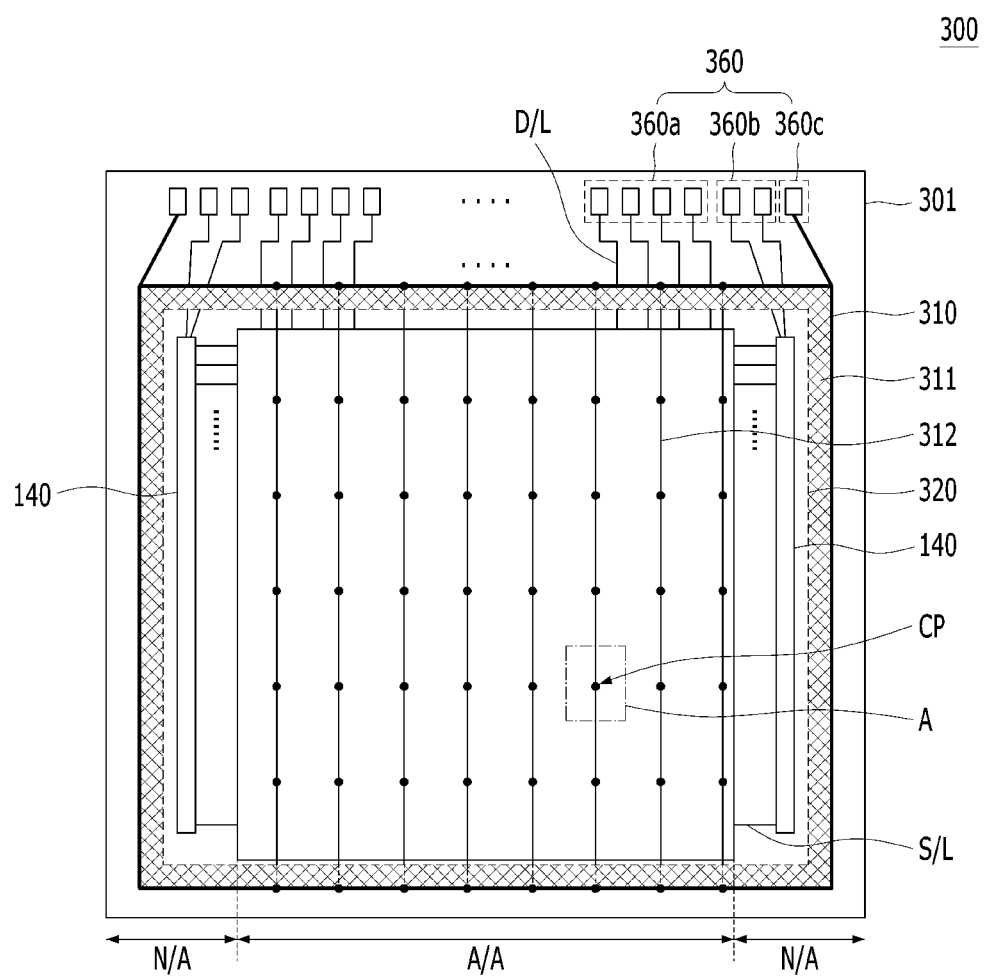
FIG. 3 is a plan view of an array substrate of an organic electroluminescent display device according to another aspect of the present disclosure.
Figure 6:
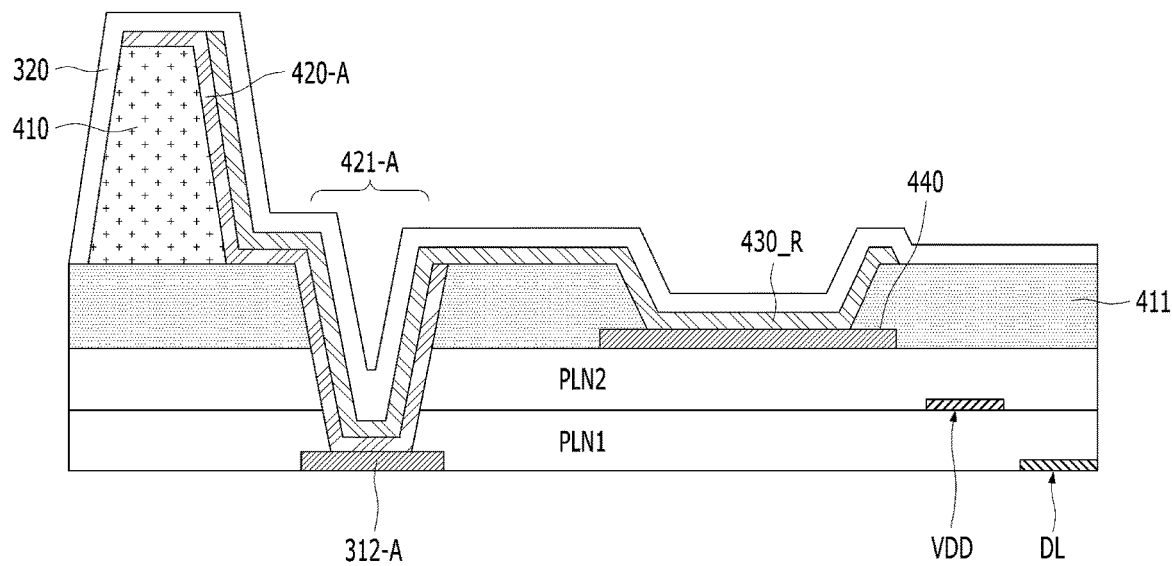
FIG. 6 is a cross-sectional view of a portion of FIG. 4 taken along line I-I' in FIG. 4, illustrating another aspect of the present disclosure.

FIGS. 3 and 6 show that an auxiliary common voltage supply line 312 is formed on the same layer as a common voltage supply line 310 in accordance with another aspect of the present disclosure, that is, a second aspect.

That is, the configuration of this aspect is identical to that of the first aspect of the present disclosure shown in FIG. 2. However, this aspect is different from the first aspect in that the auxiliary common voltage supply line 312 is not formed on a second planarization layer PLN2, but is formed on a passivation layer, that is a second interlayer insulating layer 708, formed on the same layer as a data line D/L.

Referring to FIGS. 3 and 6, the common voltage supply line 310 formed in the non-display area N/A and the auxiliary common voltage supply line 312 extending from the common voltage supply line 310 to the display area A/A are formed on the same layer. Accordingly, the auxiliary common voltage supply line 312 may be formed simultaneously with the common voltage supply line 310 in a procedure of forming the common voltage supply line 310, using one mask. Accordingly, it may be unnecessary to perform a separate mask process for formation of the auxiliary common voltage supply line 312.

The data line D/L may be formed on the same layer as the common voltage supply line 310. In the second aspect of the present disclosure, accordingly, it is desirable that the auxiliary common voltage supply line 312 and the data line D/L be arranged in parallel because the auxiliary common voltage supply line 312 and the data line D/L are formed on the same layer across the display area A/A.

Referring to FIGS. 3, 6 and 7, although the auxiliary common voltage supply line 312 has been described in the second aspect of the present disclosure as being formed on the second interlayer insulating layer 708, the auxiliary common voltage supply line 312 may be formed over a first planarization layer PLN1. In this case, the auxiliary common voltage supply line 312 may be formed on the same layer as a power supply line VDD. In this case, it is desirable that the auxiliary common voltage supply line 312 be arranged in parallel to the power supply line VDD.

Hereinafter, the configuration of the connection point CP shown in FIGS. 2 and 3 will be described in detail with reference to FIGS. 4 and 5.

The connection point CP is a region interconnecting the auxiliary common voltage supply line 312 and the cathode 320 disposed in the display area A/A.

In particular, the connection point CP is characterized in that the connection point CP is disposed at an upper end of a spacer protruding upwards in the display area A/A.

Figure 4:
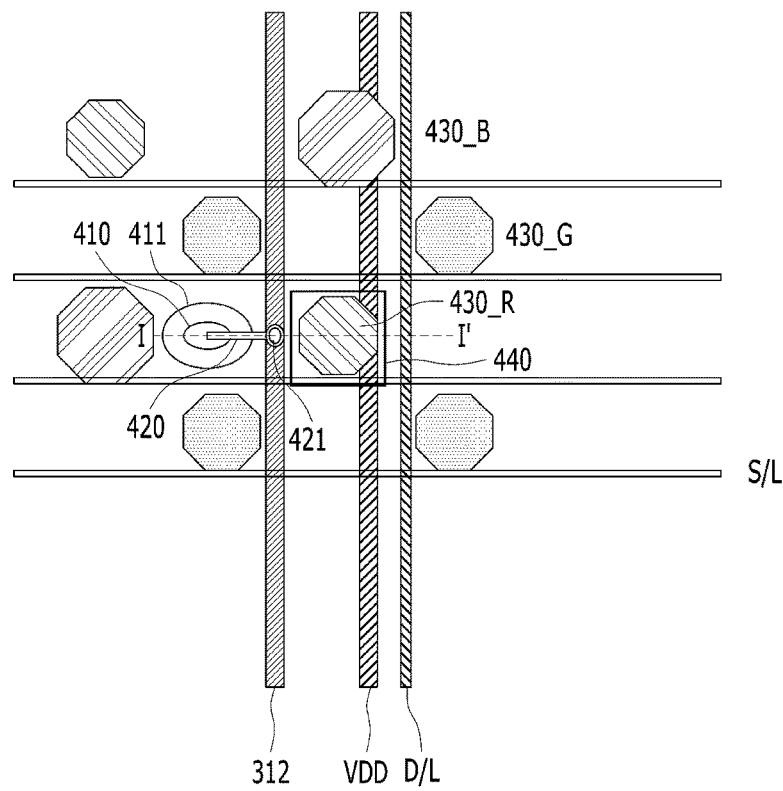
FIG. 4 is a plan view showing an arrangement of an auxiliary common voltage supply line, a unit pixel and a first auxiliary connection line according to an aspect of the present disclosure.

FIG. 4 is a plan view showing surroundings of a sub-pixel region as a portion of the display area A/A.

Referring to FIG. 4, a plurality of gate lines S/L is arranged in the display area A/A, and a plurality of data lines D/L perpendicularly intersecting the gate lines S/L is arranged in the display area A/A. One sub-pixel is disposed in a sub-pixel region defined through intersection of one gate line S/L and one data line D/L. Reference numerals 430_R, 430_G, and 430_B designate red, green and blue sub-pixels, respectively.

A power supply line VDD is disposed in the display area A/A while being adjacent and parallel to the data line D/L.

Meanwhile, the auxiliary common voltage supply line 312 is disposed in the display area A/A while being parallel to the data line D/L and the power supply line VDD.

In the aspect of the present disclosure referring to FIG. 5, the data line D/L, the power supply line VDD, and the auxiliary common voltage supply line 312 are disposed on different layers, respectively. That is, referring to FIGS. 5 and 7, the data line D/L is disposed on the second interlayer insulating layer 708, the power supply line VDD is disposed on the first planarization layer PLN1, and the auxiliary common voltage supply line 312 is disposed on the second planarization layer PLN2.

The auxiliary common voltage supply line 312 is covered by a bank layer 411.

The bank layer 411 is a pixel defining layer that defines a position on which an emission layer is deposited, that is, a sub-pixel region. In addition, a spacer 410 is further formed on the bank layer 411, together with the bank layer 411, when the bank layer 411 is formed.

The spacer 410 is a location where a fine metal mask (FMM) used upon deposition of an emission layer in the sub-pixel region will be laid, and protrudes upwardly of the substrate.

Meanwhile, referring to FIGS. 4 and 5, in an aspect of the present disclosure, a first auxiliary connection line 420, which interconnects the auxiliary common voltage supply line 312 and the cathode 320, is disposed at an upper surface of the bank layer 411 and an upper end of the spacer 410.

One end of the first auxiliary connection line 420 is connected to the auxiliary common voltage supply line 312 via a contact hole 421 formed to extend through the bank layer 411, and the other end of the first auxiliary connection line 420 is disposed at the upper end of the spacer 410 and, as such, is connected to the cathode 320. That is, a common voltage VSS is supplied to the cathode 320 after sequentially passing through the common voltage supply line 310, the second auxiliary connection line 311, the auxiliary common voltage supply line 312 and the first auxiliary connection line 420.

The first auxiliary connection line 420 is a separate line disposed on a layer different from those of the first electrode 440 as the anode and the second electrode 320 as the cathode. Accordingly, a separate mask for formation of the first auxiliary connection line 420 may be needed.

FIG. 5 is a cross-sectional view taken along line I-I' in FIG. 4. The configuration of the connection point CP according to the aspect of the present disclosure will be described in more detail with reference to FIG. 5.

FIG. 5 shows one sub-pixel and the spacer 410 adjacent thereto. A driving device layer (not shown) under the first planarization layer PLN1 is omitted for convenience of description. In particular, the driving device layer (not shown) may be a configuration of the driving device layer shown in FIG. 7. The driving device layer includes source and drain electrodes of a thin film transistor, and includes a data line DL applying a data signal to the thin film transistor.

The first planarization layer PLN1 is formed over the data line DL. The power supply line VDD is formed on the first planarization layer PLN1. The power supply line VDD may be arranged in a direction parallel to the data line DL. Since the power supply line VDD is formed on a layer different from that of the data line DL, the power supply line VDD may be formed on the first planarization layer PLN1 in the form of a mesh.

The second planarization layer PLN2 may further be formed over the power supply line VDD. The second planarization layer PLN2 planarizes the substrate formed with the power supply line VDD.

The first electrode 440 as the anode and the auxiliary common voltage supply line 312 are formed on the second planarization layer PLN2. The first electrode 440 is formed in a divided manner on a sub-pixel basis. That is, first electrodes 440 are formed at red, green blue sub-pixels, respectively, and the first electrodes 440 formed at respective sub-pixels are physically separated from one another. In addition, each first electrode 440 is electrically connected to the thin film transistor (not shown) formed under the first and second planarization layers PLN1 and PLN2.

The first electrodes 440 are disposed in the form of a matrix in the display area A/A. The auxiliary common voltage supply line 312 may be arranged in the form of a stripe in the display area A/A in parallel to the data line DL while being disposed among the first electrodes 440 arranged in the form of a matrix. As described above, the first electrodes 440 may be arranged in the form of a lattice rather than a stripe.

Of course, the auxiliary common voltage supply line 312 is arranged to be physically separated from the first electrode 440 in the display area A/A in order to prevent short circuit therebetween.

Since the auxiliary common voltage supply line 312 is connected to the second electrode 320 via the first auxiliary connection line 420 disposed at the upper end of the spacer 410, it is desirable that the auxiliary common voltage supply line 312 be arranged as adjacent to the spacer 410 as possible.

The auxiliary common voltage supply line 312 is connected to the common voltage supply line 310 via the second auxiliary connection line 311 formed in the non-display area N/A.

The auxiliary common voltage supply line 312 and the second auxiliary connection line 311 may be formed on the same plane as the first electrode 440, simultaneously with the first electrode 440. Accordingly, the auxiliary common voltage supply line 312 and the second auxiliary connection line 311 may be integrally formed.

The bank layer 411 is formed over the first electrode 440 and the auxiliary common voltage supply line 312. The bank layer 411 is an organic layer defining each sub-pixel, and covers the entirety of the display area A/A. The bank layer 411 exposes an upper end of the first electrode 440 such that a sub-pixel region corresponding to the first electrode 440 is defined.

In addition, the bank layer 411 may further include the spacer 410 which protrudes upwards from an upper surface of the bank layer 411. The spacer 410 is formed of an organic layer, similarly to the bank layer 411. The bank layer 411 and the spacer 410, which has a height greater than the thickness of the bank layer 411 by 5 to 6 times, are formed through one photolithography process using a halftone mask.

The spacer 410 functions to support a fine metal mask (FMM) used upon depositing an emission layer in a sub-pixel region defined by the bank layer 411.

The spacer 410 is disposed at a lower density than the density of unit pixels disposed per unit area by $\frac{1}{10}$ to $\frac{1}{20}$ times.

Since the spacer 410 protrudes upwards from the bank layer 411, the upper end of the spacer 410 is a location advantageous for interconnection between the second electrode 320 and the auxiliary common voltage supply line 312.

In an aspect of the present disclosure, accordingly, the first auxiliary connection line 420 interconnecting the auxiliary common voltage supply line 312 and the second electrode 320 is disposed at the upper end of the spacer 410.

One end of the first auxiliary connection line 420 is disposed at the upper end of the spacer 410, and the other end of the first auxiliary connection line 420 is connected to the auxiliary common voltage supply line 312 via the contact hole 421 formed at the bank layer 411.

The contact hole 421 is formed simultaneously with patterning of the bank layer 411 for definition of a sub-pixel region. Accordingly, a separate process for formation of the contact hole 421 is unnecessary.

The first auxiliary connection line 420 is formed through a separate mask process. That is, a conductive metal layer is deposited and patterned under the condition that the contact hole 421 and the sub-pixel region are defined at the bank layer 411, thereby forming the first auxiliary connection line 420 such that one end thereof is connected to the auxiliary common voltage supply line 312, and the other end thereof is disposed at the upper end of the spacer 410.

The emission layer 430_R is deposited in the sub-pixel region defined by the bank layer 411. The emission layer 430_R includes a light emission material layer, in which an actual light emission material is present, and an electron injection layer EIL, a hole injection layer HIL, an electron transport layer ETL and a hole transport layer HTL assisting migration of electrons or holes. In particular, the light emission material layer is deposited in the sub-pixel region corresponding thereto, but the electron injection layer EIL, the hole injection layer HIL, the electron transport layer ETL and the hole transport layer HTL may be deposited on the entire surface of the substrate, as a common layer assisting light emission. As such, the emission layer 430_R may cover the upper end of the spacer 410, thereby preventing the first auxiliary connection line 420 and the second electrode 320 from contacting each other. To this end, in an aspect of the present disclosure, the emission layer 430_R at the upper end of the spacer 410 is removed through a separate emission layer removal process. As a result, the first auxiliary connection line 420 may electrically contact the second electrode 320 at the upper end of the spacer 410.

Although it is unnecessary for the first auxiliary connection line 420 and the second electrode 320 to be interconnected at upper ends of all spacers 410, it is desirable that the first auxiliary connection line 420 and the second electrode 320 be interconnected at the upper end of the spacer 410 adjacent to the auxiliary common voltage supply line 312.

A common voltage may be uniformly provided to the display area A/A through the auxiliary common voltage supply line 312 and the first auxiliary connection line 420 disposed in the display area A/A. As a result, the display area A/A may receive a uniform common voltage, irrespectively of a position of the second electrode 320 in the display area A/A.

FIG. 6 is a cross-sectional view explaining a configuration of a connection point CP according to another aspect of the present disclosure.

Although the aspect of FIG. 6 has the same basic configuration as the aspect of FIG. 5, there is a variation in a part of the configuration in the aspect of FIG. 6 in accordance with a difference of the aspect of FIG. 6 from the aspect of FIG. 5 in terms of a position where an auxiliary common voltage supply line 312-A is formed.

That is, in this aspect, the auxiliary common voltage supply line 312-A may be formed on the same layer as a data line DL by the same material as the data line DL. In a procedure of forming the data line DL, the auxiliary common voltage supply line 312-A may be formed together with the data line DL. Accordingly, it is desirable that the auxiliary common voltage supply line 312-A and the data line DL be formed to be spaced apart from each other while being parallel to each other.

One end of the first auxiliary connection line 420-A is connected to a second electrode 320 at an upper end of a spacer 410, and the other end of the first auxiliary connection line 420-A is connected to an auxiliary common voltage supply line 312 via a contact hole 421-A formed through first and second planarization layers PLN1 and PLN2.

The contact hole 421-A may be formed upon defining a sub-pixel region after deposition of a bank layer 411. The contact hole 421-A may be formed through a process using a halftone mask because it is necessary to not only remove the bank layer 411, but also to remove the first planarization layer PLN1 and the second planarization layer PLN2.

Although not shown in FIGS. 5 and 6, the auxiliary common voltage supply line 312-A may also be formed over the first planarization layer PLN1 in accordance with another aspect of the present disclosure. That is, the auxiliary common voltage supply line 312-A may be formed on the first planarization layer PLN1, together with a power supply line VDD. Even in this case, the power supply line VDD and the auxiliary common voltage supply line 312-A may be arranged in parallel while being spaced apart from each other.

Hereinafter, a manufacturing process of an organic electroluminescent display device according to an aspect of the present disclosure will be described with reference to FIGS. 7, 8, and 9A to 9E.

A manufacturing process of a driving device part DP has been described in conjunction with the structure of the driving device part DP according to the aspect of the present disclosure referring to FIG. 7 and, as such, no description thereof will be given.

A first planarization layer PLN1 is coated over the driving device part DP, which includes a driving thin film transistor 740 and a switching thin film transistor 750, to cover the entire surface of a display area A/A.

The first planarization layer PLN1 is formed by thickly coating an organic layer of, for example, a photoacryl material or polyimide, over the entire surface of a substrate and, as such, planarizes an upper surface of the substrate having irregularities due to formation of the driving thin film transistor 740, that is, a first thin film transistor, and the switching thin film transistor 750, that is, a second thin film transistor.

The first planarization layer PLN1 includes a contact hole exposing a drain electrode of one of the thin film transistors constituting the driving device part DP. A drain connection electrode 713D is formed over the first planarization layer PLN1 formed with the contact hole. The drain connection electrode 713D interconnects a first electrode 440 constituting a light emitting device part EP and the driving device part DP.

Figure 9A:
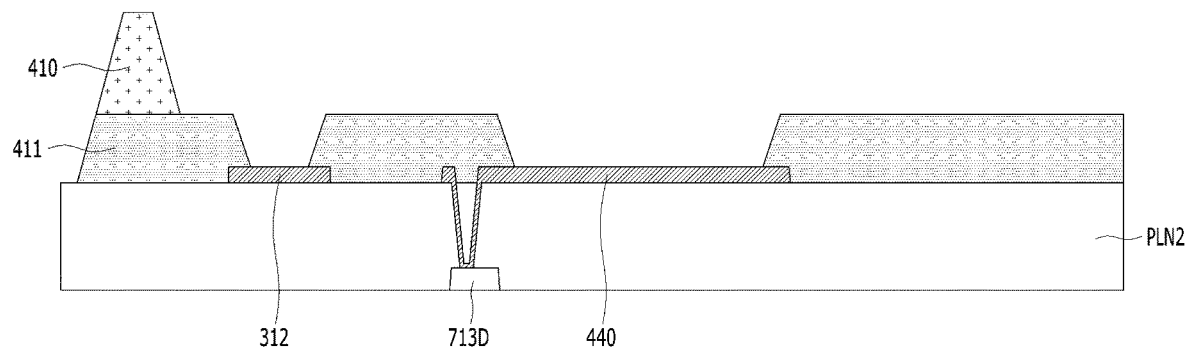
FIGS. 9A to 9E are cross-sectional views showing a part of a manufacturing process according to an aspect of the present disclosure.

Referring to FIG. 9A, a second planarization layer PLN2 is coated on the first planarization layer PLN1 formed with the drain connection electrode 713D. The second planarization layer PLN2 includes a contact hole exposing an upper end of the drain connection electrode 713D. For formation of this contact hole, a separate mask process is needed. That is, the contact hole exposing the drain connection electrode 713D is formed at the second planarization layer PLN2 through a photolithography process.

Thereafter, a first electrode 440, which is an anode, and an auxiliary common voltage supply line 312 are formed on the second planarization layer PLN2. Referring to FIG. 8, a second auxiliary connection line 311, which interconnects a common voltage supply line 310 and a second electrode 320 formed in a non-display area N/A, is further formed on the second planarization layer PLN2 in the non-display area N/A.

The auxiliary common voltage supply line 312 and the second auxiliary connection line 311 may be integrally formed. That is, the second auxiliary connection line 311 may be disposed in the non-display area N/A, to surround a display area A/A, and the auxiliary common voltage supply line 312, which extends while being integrated with the second auxiliary connection line 311, may be disposed in the display area A/A. Accordingly, the auxiliary common voltage supply line 312 may be disposed in the display area A/A while interconnecting the second auxiliary connection line 311 disposed at one side of the substrate and the second auxiliary connection line 311 disposed at the other side of the substrate facing the one side of the substrate.

Subsequently, referring to FIG. 9A, a bank layer 411 constituted by an organic layer of, for example, photoacryl, may be deposited on the second planarization layer PLN2 formed with the first electrode 440 and the auxiliary common voltage supply line 312.

Next, the bank layer 411 corresponding to the first electrode 440 is removed, thereby defining a sub-pixel region. At the same time, a contact hole is formed to expose a portion of the auxiliary common voltage supply line 312.

The bank layer 411 includes a spacer 410 protruding in a light emission direction. That is, the bank layer 411 and the spacer 410, which protrudes from an upper end of the bank layer 411, may be formed by thickly coating a photoresist material, and then patterning the photoresist material using a halftone mask such that a step is formed.

The spacer 410 may have a height corresponding to 5 to 10 times the thickness of the bank layer 411.

Figure 9B:
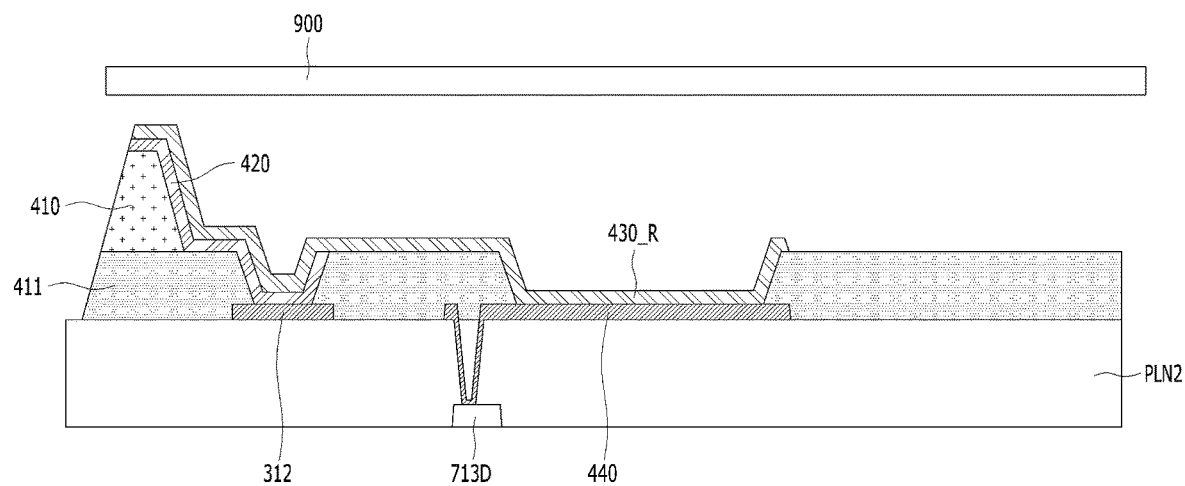

Thereafter, referring to FIG. 9B, a first auxiliary connection line 420 is formed on the bank layer 411, through which the first electrode 440 and a portion of the auxiliary common voltage supply line 312 are exposed in accordance with definition of the sub-pixel region.

The first auxiliary connection line 420 is formed in the form of a plurality of patterns through deposition of a conductive metal layer on the bank layer 411 and execution of a photolithography process. It is important to perform the patterning such that one end of the first auxiliary connection line 420 is disposed at an upper end of the spacer 410.

Subsequently, an emission layer 430_R is deposited in the sub-pixel region. Upon being classified, the emission layer 430_R includes a hole injection layer HIL, a hole transport layer HTL, a light emission material layer EL, an electron transport layer ETL, and an electron injection layer EIL. The hole injection layer HIL, the hole transport layer HTL, the electron transport layer ETL, and the electron injection layer EIL are integrally deposited on the entire upper surface of the display area A/A, as a common layer. The light emission material layer EL is an organic material layer independently formed in each sub-pixel region. The light emission material layer EL may generate light classified into red, green and blue.

Since the common layer is deposited on the bank layer 411 after formation of the first auxiliary connection line 420, the common layer may completely cover the first auxiliary connection line 420. That is, the common layer may cover the first auxiliary connection line 420 even at the upper end of the spacer 410.

In the aspect of the present disclosure, accordingly, a process for removing the common layer deposited over the first auxiliary connection line 420 at the upper end of the spacer 410 is needed.

The common layer is formed by an organic material and, as such, has certain adhesiveness. In the aspect of the present disclosure, accordingly, the adhesive common layer at the upper end of the spacer 410 is removed using an organic material adsorption substrate 900.

Figure 9C:
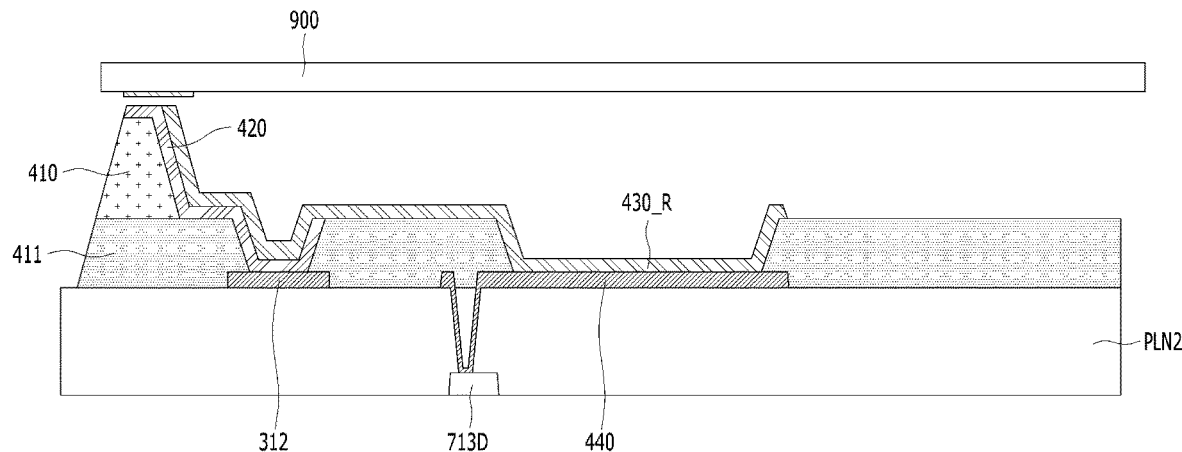

Referring to FIGS. 9B and 9C, after deposition of the emission layer 430_R on the bank layer 411, the substrate 301 and the organic material adsorption substrate 900 are aligned with each other, and the organic material adsorption substrate 900 is brought into contact with the common layer at the upper end of the spacer 410, thereby removing the common layer at the upper end of the spacer 410.

In order to effectively adsorb the common layer at the upper end of the spacer 411, an organic adsorbent or a hydrophobic adsorbent may further be coated on a surface of the organic material adsorption substrate 900.

Figure 9D:
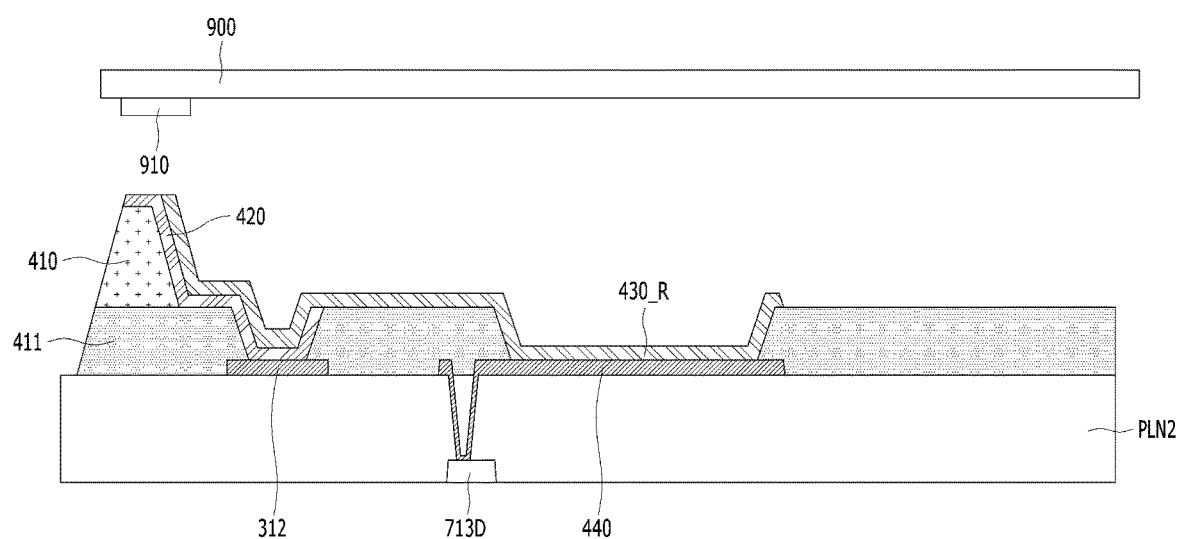

The organic material adsorption substrate 900 may further include an embossing adsorption pattern 910 corresponding to the upper end of the spacer 410, as a different structure thereof, as shown in FIG. 9D. An organic adsorbent or a hydrophobic adsorbent may be coated only on the embossing adsorption pattern 910.

Figure 9E:
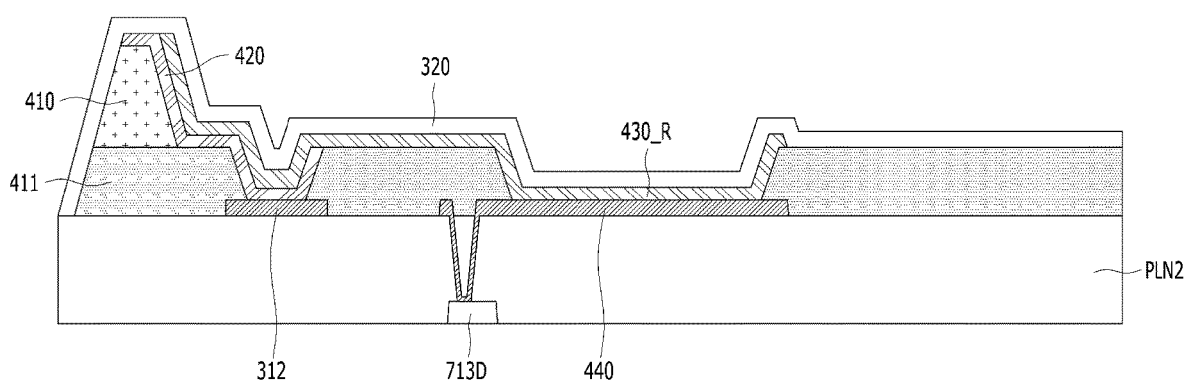

Next, referring to FIG. 9E, after removal of the common layer at the upper end of the spacer 410, the second electrode 320, which is a cathode, is deposited on the entire upper surface of the bank layer 411. The second electrode 320 is formed in the entirety of the display area A/A, as an integrated structure, and is connected to the second auxiliary connection line 311 disposed in the non-display area N/A.

Finally, referring to FIG. 8, encapsulation layers 801, 802 and 803 protecting an array substrate from an outside thereof are formed on the second electrode 320 and, as such, a display panel is completed.

As apparent from the above description, in the organic electroluminescent display device of the present disclosure, a uniform common voltage is applied to a cathode and, as such, it may be possible to remove supply deviations of the common voltage according to different positions in a display panel even when the display panel is enlarged. As a result, it may be possible to configure an organic electroluminescent display device having a uniform picture quality in that there is no common voltage deviation according to different positions of a display panel.

The foregoing descriptions and the accompanying drawings have been presented in order to illustratively explain technical ideas of the present disclosure. A person skilled in the art to which the present disclosure pertains can appreciate that diverse modifications and variations by combining, dividing, substituting for, or changing constituent elements may be possible without changing essential characteristics of the present disclosure. Therefore, the foregoing aspects disclosed herein shall be interpreted as illustrative only but not as limitative of the principle and scope of the present disclosure. It should be understood that the scope of the present disclosure shall be defined by the appended claims and all of their equivalents fall within the scope of the present disclosure.

What is claimed is:

1. An organic electroluminescent display device comprising:
   a substrate comprising a display area with unit pixels disposed therein, and a non-display area disposed around the display area;
   a plurality of gate lines and a plurality of data lines disposed on the substrate;
   a thin film transistor disposed in the display area;
   a planarization layer disposed on the thin film transistor for surface planarization;
   a first electrode disposed on the planarization layer on each unit pixel;
   a bank layer disposed on the first electrode and defining a light emission region of the unit pixels;

a spacer disposed on the bank layer;
a second electrode corresponding to the first electrode;
an emission layer disposed between the first electrode and the second electrode;
a common voltage supply line disposed in the non-display area and connected to the second electrode;
an auxiliary common voltage supply line disposed in the display area and connected to the common voltage supply line; and
a first auxiliary connection line interconnecting the auxiliary common voltage supply line and the second electrode in the display area, and
wherein the first auxiliary connection line is connected to the second electrode at an upper end of the spacer.

2. The organic electroluminescent display device according to claim 1, wherein the auxiliary common voltage supply line is disposed between the emission layer and the thin film transistor.

3. The organic electroluminescent display device according to claim 2, wherein the auxiliary common voltage supply line is formed on a same layer as the first electrode by a same material as the first electrode, and is arranged in a form of a lattice or a stripe while being insulated from the first electrode.

4. The organic electroluminescent display device according to claim 2, further comprising a power supply line configured to supply power to the thin film transistor disposed in the display area,
wherein the auxiliary common voltage supply line is formed by a same material as the power supply line while being disposed on a same layer as the power supply line in parallel to the power supply line.

5. The organic electroluminescent display device according to claim 2, wherein the auxiliary common voltage supply line is formed by a same material as the data lines, and is disposed on a same layer as the data lines in parallel to the data lines.

6. The organic electroluminescent display device according to claim 1, wherein the first auxiliary connection line is formed on upper surfaces of the bank layer and the spacer, and is connected to the auxiliary common voltage supply line via a first contact hole formed at the bank layer.

7. The organic electroluminescent display device according to claim 1, wherein the second electrode is connected to the common voltage supply line by a second auxiliary connection line formed in the non-display area by a same material as the first electrode.

8. The organic electroluminescent display device according to claim 7, wherein the common voltage supply line and the second auxiliary connection line surround the display area.

9. The organic electroluminescent display device according to claim 1, wherein the auxiliary common voltage supply line has a greater arrangement density per unit area at a central portion of the display area than at an edge portion of the display area.

10. A method for manufacturing an organic electroluminescent display device, comprising:
preparing a substrate including a display area and a non-display area formed around the display area;
forming, on the substrate, a driving device layer comprising a gate line and a data line;
forming a planarization layer on the driving device layer;
forming, on the planarization layer, a light emitting device layer comprising a first electrode, an emission layer and a second electrode;
forming a common voltage supply line in the non-display area;
forming an auxiliary common voltage supply line connected to the common voltage supply line in the display area;
forming a first auxiliary connection line interconnecting the second electrode and the auxiliary common voltage supply line in the display area;
simultaneously forming the auxiliary common voltage supply line and the first electrode insulated from the auxiliary common voltage supply line on the planarization layer;
forming, on the first electrode, a bank layer defining a light emission region and a spacer protruding upwards from the bank layer;
forming the first auxiliary connection line disposed over an upper end of the spacer and the bank layer and connected to the auxiliary common voltage supply line;
depositing the emission layer in the light emission region; and
forming the second electrode disposed on the emission layer and connected to the first auxiliary connection line at the upper end of the spacer.

11. The method according to claim 10, wherein the forming a driving device layer comprises:
forming the gate line on the substrate;
forming the data line disposed to intersect the gate line and the common voltage supply line disposed in the non-display area; and
forming the auxiliary common voltage supply line connected to the common voltage supply line while being parallel to the data line.

12. The method according to claim 11, wherein the data line, the common voltage supply line, and the auxiliary common voltage supply line are simultaneously formed.

13. The method according to claim 11, wherein the forming a driving device layer further comprises forming a power supply line insulated from the data line, and the power supply line and the auxiliary common voltage supply line are formed on a same layer.

14. The method according to claim 11, further comprising forming a second auxiliary connection line interconnecting the common voltage supply line and the second electrode in the non-display area, simultaneously with the first electrode, in the forming a light emitting device layer.

15. The method according to claim 10, wherein the forming a light emitting device layer comprises:
forming, on the planarization layer, the bank layer comprising a contact hole exposing the auxiliary common voltage supply line while defining the light emission region, through a photolithography process; and
forming the first auxiliary connection line connected to the auxiliary common voltage supply line via the contact hole.

16. The method according to claim 10, wherein the forming a light emitting device layer comprises:
forming the emission layer on the bank layer formed with the auxiliary common voltage supply line;
removing the emission layer remaining at the upper end of the spacer, thereby exposing the auxiliary common voltage supply line; and
forming the second electrode connected to the auxiliary common voltage supply line at the upper end of the spacer.

17. The method according to claim 16, wherein the removing the emission layer remaining at the upper end of the spacer, thereby exposing the auxiliary common voltage supply line comprises:
- aligning an organic material adsorption substrate on the bank layer and the spacer with the emission layer deposited thereon; and
- bringing the organic material adsorption substrate and the upper end of the spacer into contact with each other, thereby adsorbing the emission layer at the upper end of the spacer.

18. The method according to claim 17, wherein the organic material adsorption substrate further comprises an embossing adsorption pattern aligned with the upper end of the spacer.

\* \* \* \* \*